United States Patent
Fukasaku

(10) Patent No.: US 8,810,982 B2
(45) Date of Patent: Aug. 19, 2014

(54) SEMICONDUCTOR INTEGRATED CIRCUIT AND PROTECTION CIRCUIT

(75) Inventor: Katsuhiko Fukasaku, Kanagawa (JP)

(73) Assignee: Sony Corporation, Tokyo (JP)

( * ) Notice: Subject to any disclaimer, the term of this patent is extended or adjusted under 35 U.S.C. 154(b) by 187 days.

(21) Appl. No.: 13/592,449

(22) Filed: Aug. 23, 2012

(65) Prior Publication Data

US 2013/0057993 A1    Mar. 7, 2013

(30) Foreign Application Priority Data

Sep. 1, 2011   (JP) ................................. 2011-190431

(51) Int. Cl.
*H02H 9/00* (2006.01)

(52) U.S. Cl.
USPC .......................................................... 361/56

(58) Field of Classification Search
USPC .......................................................... 361/56
See application file for complete search history.

(56) References Cited

U.S. PATENT DOCUMENTS

| 5,959,488 A * | 9/1999 | Lin et al. ........................ 327/313 |
| 6,249,410 B1 * | 6/2001 | Ker et al. ......................... 361/56 |
| 7,233,475 B1 * | 6/2007 | Chen ............................. 361/111 |

FOREIGN PATENT DOCUMENTS

| JP | 2004-014929 | 1/2004 |
| JP | 2006-121007 | 5/2006 |

* cited by examiner

*Primary Examiner* — Stephen W Jackson
(74) *Attorney, Agent, or Firm* — Rader, Fishman & Grauer PLLC

(57) ABSTRACT

Disclosed herein is a semiconductor integrated circuit including: a clamp MOS transistor having a drain region and a source region connected to a power source wiring and a grounding wiring, respectively, and causing a surge current to flow through a channel path and a bipolar path between the drain region and the source region; a first trigger circuit portion provided between the power source wiring and the grounding wiring, connected at an output terminal thereof to a gate terminal of the clamp MOS transistor, and controlling switching for the channel path; a second trigger circuit portion provided between the power source wiring and the grounding wiring, connected at an output terminal thereof to a well region of the clamp MOS transistor, and controlling switching for the bipolar path; and an internal circuit connected to each of the power source wiring and the grounding wiring.

8 Claims, 6 Drawing Sheets

F I G . 1
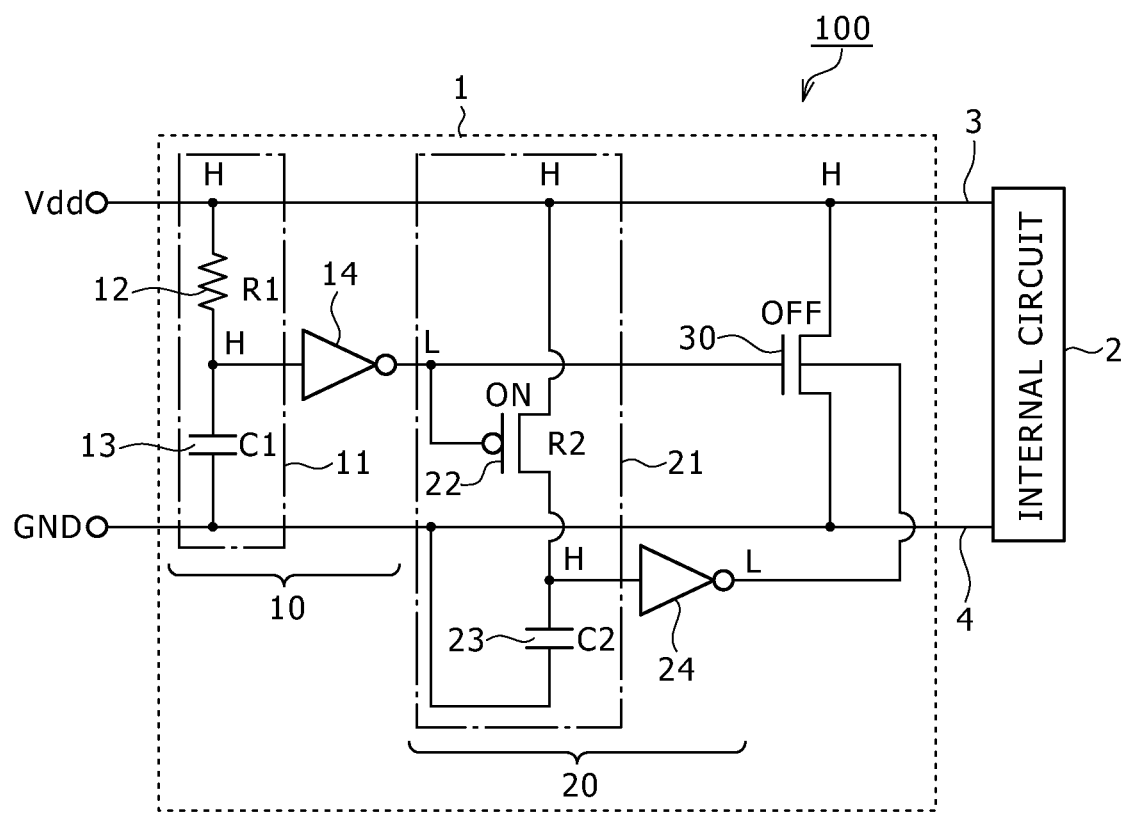

US 8,810,982 B2

SEMICONDUCTOR INTEGRATED CIRCUIT AND PROTECTION CIRCUIT

BACKGROUND

The present disclosure relates to a protection circuit which prevents electrostatic breakdown of a semiconductor integrated circuit from being caused, and a semiconductor integrated circuit including the same.

Heretofore, for the purpose of preventing electrostatic breakdown of an internal circuit from being caused, a semiconductor integrated circuit has been provided with an Electro Static Discharge (ESD) protection circuit. Also, in general, a Resistance-capacitance (RC) trigger type power clamp Metal Oxide Semiconductor (MOS) circuit is used as the ESD protection circuit. This RC trigger type power clamp MOS circuit, for example, is described in Japanese Patent Laid-Open No. 2004-14929.

This type of ESD protection circuit normally includes an RC series circuit having a resistive element and a capacitive element, and a Complementary MOS (CMOS) inverter. In this case, the RC series circuit is provided between a power source wiring and a grounding wiring. Also, an input terminal of the CMOS inverter is connected to a connection point between the resistive element and the capacitive element of the RC series circuit. In addition, the ESD protection circuit includes a clamp MOS transistor composed of an N-channel MOS Field Effect Transistor (MOSFET) in which a conductivity type of current carriers is an N type. A gate terminal of the clamp MOS transistor is connected to an output terminal of the CMOS inverter, and a drain terminal and a source terminal of the clamp MOS transistor are connected to the power source wiring and the grounding wiring, respectively.

In the ESD protection circuit having the configuration described above, the moment an ESD surge (high-voltage pulse) is generated to enter the ESD protection circuit, a through current is caused to flow through the RC series circuit of the resistive element and the capacitive element, and thus a voltage level developed at an input terminal of the CMOS inverter is changed from a High level to a Low level. As a result, a signal (voltage) set at the High level is applied from the CMOS inverter to the gate terminal of the clamp MOS transistor, so that the clamp MOS transistor is set in an ON state. As a result, an ESD surge current is caused to flow through a channel between a drain region and a source region of the clamp MOS transistor, thereby making it possible to protect an internal circuit of the semiconductor integrated circuit. It is noted that in the ESD protection circuit having the configuration described above, a period of time for which in a phase of generation of the ESD, the clamp MOS transistor becomes the ON state (a time for current flow of the ESD surge current) is determined depending on a time constant (RC) of the RC series circuit.

In addition, heretofore, there has been proposed an ESD protection circuit configured in such a way that the ESD protection circuit supplies an output signal from a CMOS inverter not only to a gate terminal of a clamp MOS transistor, but also to a well region (body). This ESD protection circuit, for example, is described in Japanese Patent Laid-Open No. 2006-121007.

SUMMARY

As described above, heretofore, the ESD protection circuits having the various kinds of configurations have been proposed in the semiconductor integrated circuit. In this technical field, however, the development of the ESD protection circuit which can cause the ESD surge current to more efficiently flow is desired.

The present disclosure has been made in order to solve the problems described above, and it is therefore desirable to provide an ESD protection circuit which is capable of causing an ESD surge current to more efficiently flow, and a semiconductor integrated circuit including the same.

According to an embodiment of the present disclosure, there is provided a semiconductor integrated circuit including: a clamp MOS transistor having a drain region and a source region connected to a power source wiring and a grounding wiring, respectively, and causing a surge current to flow through a channel path and a bipolar path between the drain region and the source region; a first trigger circuit portion configured to be provided between the power source wiring and the grounding wiring, connected at an output terminal thereof to a gate terminal of the clamp MOS transistor, and control switching for the channel path within the clamp MOS transistor; a second trigger circuit portion configured to be provided between the power source wiring and the grounding wiring, connected at an output terminal thereof to a well region of the clamp MOS transistor, and control switching for the bipolar path within the clamp MOS transistor; and an internal circuit connected to each of the power source wiring and the grounding wiring.

According to another embodiment of the present disclosure, there is provided a protection circuit including: a clamp MOS transistor having a drain region and a source region connected to a power source wiring and a grounding wiring, respectively, and causing a surge current to flow through a channel path and a bipolar path between the drain region and the source region; a first trigger circuit portion configured to be provided between the power source wiring and the grounding wiring, connected at an output terminal thereof to a gate terminal of the clamp MOS transistor, and control switching for the channel path within the clamp MOS transistor; and a second trigger circuit portion configured to be provided between the power source wiring and the grounding wiring, connected at an output terminal thereof to a well region of the clamp MOS transistor, and control switching for the bipolar path within the clamp MOS transistor.

As set forth hereinabove, in the semiconductor integrated circuit and the protection circuit according to the present disclosure, the two paths of the channel path and the bipolar path are used as the paths for the surge current within the clamp MOS transistor. Also, in the present disclosure, the switching operations for the two current flow paths are individually controlled by the two trigger circuit portions: the first trigger circuit portion; and the second trigger circuit portion corresponding to the two current flow paths, respectively. According to the present disclosure, with this configuration, it is possible to cause the ESD surge current to efficiently flow through the protection circuit.

BRIEF DESCRIPTION OF THE DRAWINGS

FIG. 1 is a schematic circuit diagram, partly in block, showing a configuration of a semiconductor integrated circuit according to a first embodiment of the present disclosure including an ESD protection circuit as a protection circuit according to a second embodiment of the present disclosure;

DETAILED DESCRIPTION OF THE PREFERRED EMBODIMENTS

Figure 2:
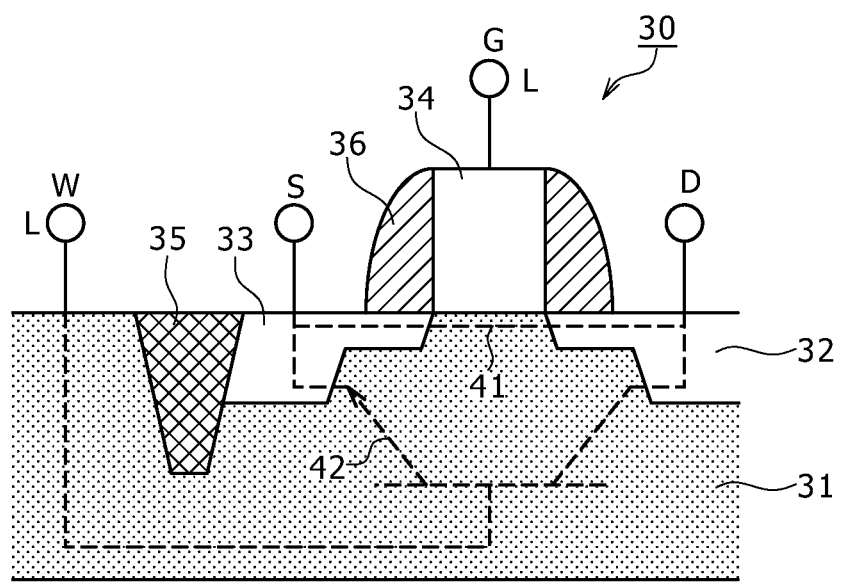
FIG. 2 is a schematic cross sectional view showing a structure of a clamp MOS transistor used in the semiconductor integrated circuit according to the first embodiment of the present disclosure.

Hereinafter, an ESD protection circuit and a semiconductor integrated circuit including the ESD protection circuit according to first and second embodiments of the present disclosure will be described in detail with reference to the accompanying drawings in accordance with the following order. It should be noted that the present disclosure is by no means limited to the embodiments and the like which will be described below.

1. Configurations of Semiconductor Integrated Circuit and ESD Protection Circuit
2. Operation of ESD Protection Circuit
3. Comparative Example
4. Various Kinds of Modified Changes

1. Configurations of Semiconductor Integrated Circuit and ESD Protection Circuit

[Configuration of Semiconductor Integrated Circuit]

FIG. 1 is a schematic circuit diagram, partly in block, showing a configuration of a semiconductor integrated circuit according to a first embodiment of the present disclosure including an ESD protection circuit as a protection circuit according to a second embodiment of the present disclosure. It is noted that FIG. 1 is a schematic circuit diagram, partly in block, showing a situation of constituent elements of the semiconductor integrated circuit 100 in a state (standby state) in which no ESD is generated. Also, "H" and "L" described in input/output terminals of the constituent elements, and connection points within the circuit in FIG. 1 represent voltage levels of a High level and a Low level, respectively.

The semiconductor integrated circuit 100 includes an ESD protection circuit 1 (protection circuit) according to a second embodiment of the present disclosure, an internal circuit 2, a power source wiring 3, and a grounding wiring 4. It is noted that in the first embodiment, there is described the case where a power source voltage Vdd is supplied to the power source wiring 3, and the grounding wiring 4 is connected to a grounding terminal.

The ESD protection circuit 1 is a circuit which, when an ESD surge is generated to enter the semiconductor integrated circuit 100, causes an ESD surge current $I_{ESD}$ (surge current) to flow through an inside of the semiconductor integrated circuit 100 to prevent the breakdown of the internal circuit 2 by the ESD. It is noted that an internal configuration of the ESD protection circuit 1 will be described later.

The internal circuit 2 is connected to each of the power source wiring 3 and the grounding wiring 4 through the ESD protection circuit 1. The internal circuit 2, for example, is composed of a logic Large Scale Integration (LSI), a memory LSI or the like, and executes various kinds of pieces of arithmetic operation processing.

It is noted that although the case where the semiconductor integrated circuit 100 includes the power source wiring 3 and the grounding wiring 4 is shown in the first embodiment, the present disclosure is by no means limited thereto. That is to say, a configuration may also be adopted such that when the semiconductor integrated circuit 100, for example, is mounted to a predetermined electronic apparatus or the like, the ESD protection circuit 1 including RC trigger circuits and a clamp MOS which will be described later) and the internal circuit 2 are connected to a power source wiring and a grounding wiring which are provided outside the semiconductor integrated circuit 100. That is to say, in the first embodiment, a configuration may also be adopted such that the semiconductor integrated circuit 100 includes none of the power source wiring 3 and the grounding wiring 4.

[Configuration of ESD Protection Circuit]

The ESD protection circuit 1 according to the second embodiment of the present disclosure, as shown in FIG. 1, includes a first RC trigger circuit portion 10 (first trigger circuit portion), a second RC trigger circuit portion 20 (second trigger circuit portion), and a clamp MOS transistor 30 (hereinafter simply referred to as "a clamp MOS").

The first RC trigger circuit portion 10 includes a first RC series circuit 11 and a first CMOS inverter 14 (first inverter circuit). In this case, the first RC series circuit 11 is configured by connecting a first resistive element 12 and a first capacitive element 13 in series with each other.

The first RC series circuit 11 is provided between the power source wiring 3 and the grounding wiring 4. In this case, an end portion of the first RC series circuit 11 on a side of the first resistive element 12 is connected to the power source wiring 3, and an end portion of the first RC series circuit 11 on a side of the first capacitive element 13 is connected to the grounding wiring 4. In addition, an input terminal of the first CMOS inverter 14 is connected to a connection point (node) between the first resistive element 12 and the first capacitive element 13. Also, an output terminal of the first CMOS inverter 14 is connected to a gate terminal of the clamp MOS 30, and a gate terminal of a second resistive element 22 which is provided within the second RC trigger circuit portion 20 and which will be described later.

The first resistive element 12, for example, can be composed of a resistive element made of a material such as poly silicon, a MOSFET (resistance change device) or the like. In the second embodiment, the first resistive element 12 is composed of a resistive element, for example, made of poly silicon, that is, a resistive element whose resistance value R1 is constant irrespective of presence or absence of generation of the ESD. It is noted that a gate electrode made of poly silicon, of a MOSFET, for example, may be used as the resistive element made of poly silicon.

The first capacitive element 13 is composed of a capacitive element having small bias dependency. For example, the first capacitive element 13 can be composed of a capacitive element in which a gate insulating film of a MOS transistor (for example, an accumulation type MOS transistor) is used as a capacitor, a capacitive element in which an insulating film between wiring layers is used as a capacitor, or the like.

Note that, in the second embodiment, a resistance value R1 of the first resistive element 12, and a capacitance value C1 of the first capacitive element 13 are suitably set in consideration of, for example, a use application, a possible discharging phenomenon, and the like in such a way that a time constant (first time constant: T1=R1×C1) of the first RC series circuit 11 becomes a desired value. Specifically, the resistance value R1 of the first resistive element 12, for example, can be suitably set in the range of about 1,000Ω to 10 MΩ. In addition, the capacitance value C1 of the first capacitive element 13, for example, can be set in the range of about 1 pF to 10 pF.

The first CMOS inverter 14 inverts an electric potential (voltage signal) developed at a connection point between the first resistive element 12 and the first capacitive element 13, and applies the electric potential obtained through the inversion to each of a gate terminal of the clamp MOS 30, and a gate terminal of the second resistive element 22 which is provided within the second RC trigger circuit portion 20 and which will be described later.

The second RC trigger circuit portion 20 includes a second RC series circuit 21 and a second CMOS inverter 24 (second inverter circuit). In this case, the second RC series circuit 21 is configured by connecting the second resistive element 22 and a second capacitive element 23 in series with each other.

The second RC series circuit 21 is provided between the power source wiring 3 and the grounding wiring 4. An end portion of the second RC series circuit 21 on a side of the second resistive element 22 is connected to the power source wiring 3, and an end portion of the second RC series circuit 21 on a side of the second capacitive element 23 is connected to the grounding wiring 4. In addition, an input terminal of the second CMOS inverter 24 is connected to a connection point (node) between the second resistive element 22 and the second capacitive element 23. Also, an output terminal of the second CMOS inverter 24 is connected to a well region of the clamp MOS 30.

The second resistive element 22, for example, can be composed of a resistive element made of a material such as poly silicon or the like, and a MOSFET or the like similarly to the case of the first resistive element 12. In the second embodiment, the second resistive element 22 is composed of a P-channel MOSFET (switching element) in which a conductivity type of current carriers is a P type. That is to say, in the second embodiment, the second resistive element 22 is composed of a resistance change device in which a resistance value when the second resistive element 22 is held in an ON state (in a phase of a standby state), and a resistance value R2 when the second resistive element 22 is held in an OFF state (in a phase of generation of the ESD) are different from each other.

The second capacitive element 23, for example, can be composed of a capacitive element in which a gate insulating film of a MOS transistor is used as a capacitor, a capacitive element using an insulating film between wiring layers, or the like similarly to the case of the first capacitive element 13.

Note that, in the second embodiment, a resistance value R2 of the second resistive element 22, and a capacitance value C2 of the second capacitive element 23 are suitably set in consideration of, for example, a use application, a possible discharging phenomenon, and the like in such a way that a time constant (second time constant: T2=R2×C2) of the second RC series circuit 21 in the phase of generation of the ESD becomes a desired value. Specifically, the resistance value R2 of the second resistive element 22 in the phase of generation of the ESD, for example, can be suitably set in the range of about 1,000Ω to 10 MΩ. In addition, the capacitance value C2 of the second capacitive element 23, for example, can be suitably set in the range of about 1 pF to 10 pF.

The second CMOS inverter 24 inverts an electric potential (voltage signal) developed at the connection point between the second resistive element 22 and the second capacitive element 23, and applies the electric potential obtained through the inversion to the well region of the clamp MOS 30.

The clamp MOS 30 is composed of an N-channel MOSFET. FIG. 2 shows a cross sectional view of the clamp MOS 30.

The clamp MOS 30 includes a well region 31, and a drain region 32 and a source region 33. In this case, the well region 31 is formed in a predetermined region of a substrate (not shown). Also, each of the drain region 32 and the source region 33 is formed so as to be buried in one surface of the well region 31. It is noted that the well region 31 is composed of a P-type impurity layer in which a conductivity type of current carriers is a P type, and each of the drain region 32 and the source region 33 is composed of an N-type impurity layer in which a conductivity type of current carriers is an N type. In addition, the clamp MOS 30 includes a gate electrode 34 formed on a surface of a region of the well region 31 between the drain region 32 and the source region 33. It is noted that the gate electrode 34 of the clamp MOS 30, for example, is made of a conductive material such as poly silicon. In addition thereto, the clamp MOS 30 includes an isolation portion 35 and a gate sidewall 36 (made of an oxide film). In this case, the isolation portion 35 is provided on a side of the source region 33 opposite to a side of the drain region 32. Also, the gate sidewall 36 is provided on a side surface of the gate electrode 34.

The clamp MOS 30 having the structure described above is provided between the power source wiring 3 and the grounding wiring 4. Also, a drain terminal D of the clamp MOS 30 is connected to the power source wiring 3, and a source terminal S thereof is connected to the grounding wiring 4. It is noted that a gate terminal G of the clamp MOS 30 is connected to an output terminal of the first CMOS inverter 14, and a well terminal W thereof is connected to an output terminal of the second CMOS inverter 24.

In the ESD protection circuit 1 of the second embodiment, as shown in FIG. 2, two current paths 41 and 42 are used as current paths for the ESD surge current provided within the clamp MOS 30. The first current path 41 is a channel (hereinafter referred to as "a channel path 41"), between the drain region 32 and the source region 33, which is formed in the well region 31 right under the gate electrode 34 when the clamp MOS 30 is set in an ON state through the gate electrode 34 thereof. In addition, the second current path 42 is a current path (hereinafter referred to as "a bipolar path 42") of a bipolar transistor, among the drain region 32, the well region 31, and the source region 33 (NPN junction) which is formed in a deep portion of the substrate of the clamp MOS 30.

Switching control (ON/OFF control) for the channel path 41 of the clamp MOS 30 is carried out in accordance with an output signal (output voltage) from the first CMOS inverter 14 of the first RC trigger circuit portion 10. Also, a period of time for which the ESD surge current is caused to flow through the channel path 41 (a period of time for opening of the channel path 41) is determined depending on the first time constant T1 (=R1×C1) of the first RC series circuit 11.

On the other hand, switching control (ON/OFF control) for the bipolar path 42 of the clamp MOS 30 is carried out in accordance with an output signal (output voltage) from the second CMOS inverter 24 of the second RC trigger circuit portion 20. Also, a period of time for which the ESD surge current is caused to flow through the bipolar path 42 (a period of time for opening of the bipolar path 42) is determined depending on the second time constant T2 (=R2×C2) of the second RC series circuit 21.

When, for example, we let the resistance value R of each of the resistive elements be 10 MΩ, and we let the capacitance value C of each of the capacitive elements be 10 pF, the time constant T of each of the RC series circuits becomes T=R× C=10 MΩ×10 pF=1 μsec, and the opening time for each of the current paths becomes about 1 μsec.

2. Operation of ESD Protection Circuit

Figure 3:
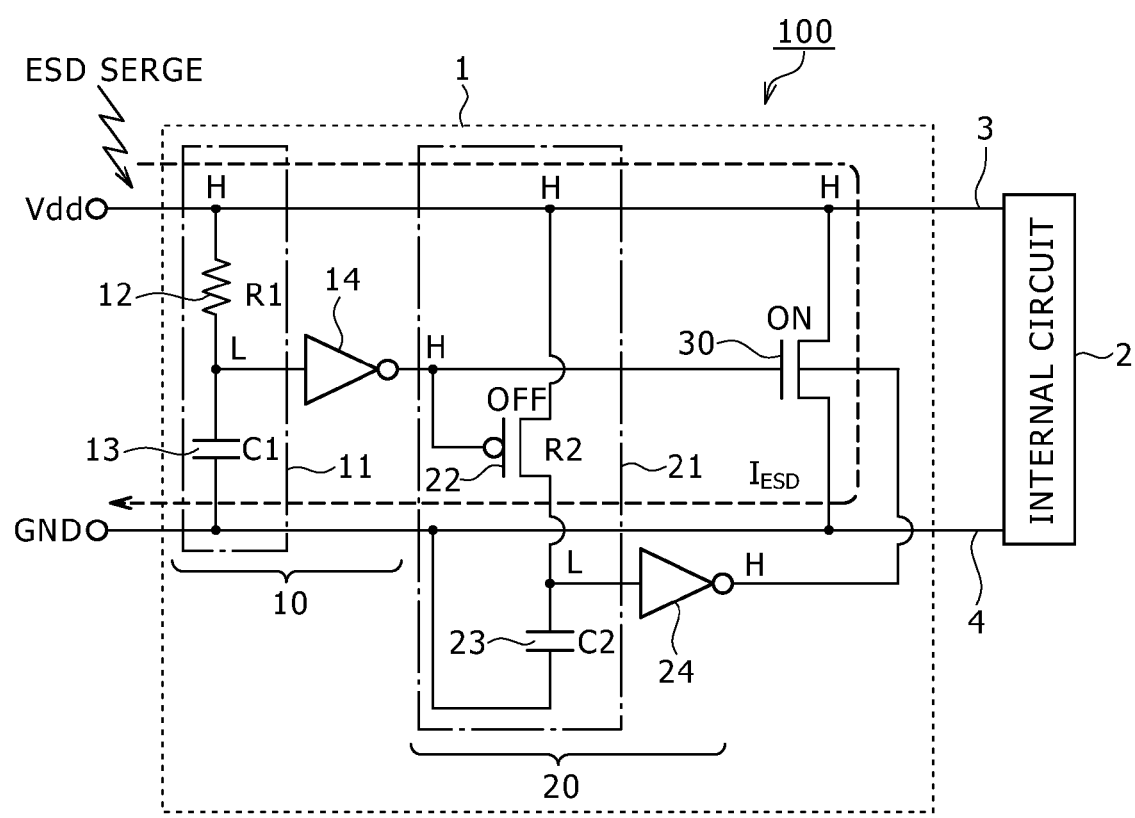
FIG. 3 is a schematic circuit diagram, partly in block, explaining an operation of the semiconductor integrated circuit according to the first embodiment of the present disclosure.
Figure 4:
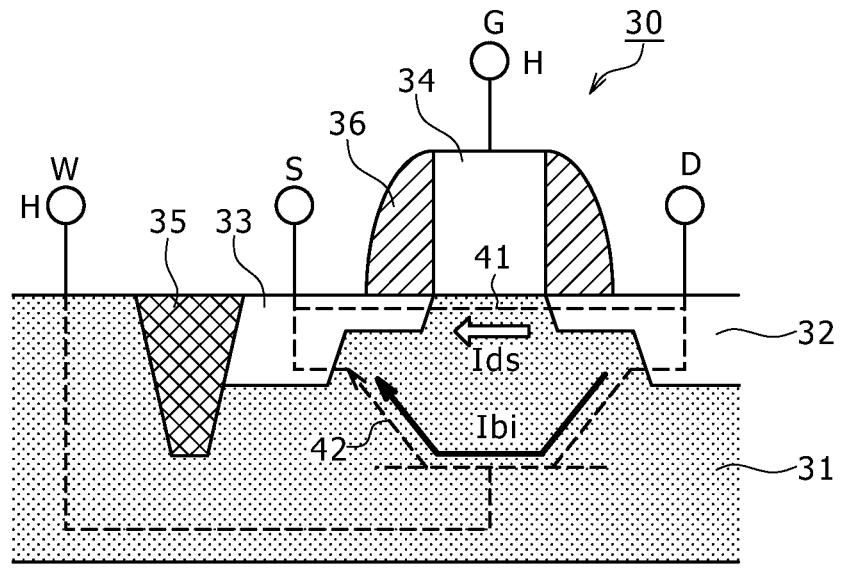
FIG. 4 is a schematic cross sectional view explaining the operation of the semiconductor integrated circuit according to the first embodiment of the present disclosure.

Next, an operation of the ESD protection circuit 1 of the second embodiment will be described with reference to FIGS. 1, 3, and 4. It is noted that FIG. 3 is a circuit diagram, partly in block, showing a situation of operations (the electric potential levels developed at the input/output terminals and the connection points of the constituent elements) of the constituent elements of the ESD protection circuit 1 when the ESD surge is generated to enter the semiconductor integrated circuit 100. In addition, FIG. 4 is a cross sectional view showing a situation of the ESD surge current which is caused to flow through the clamp MOS 30 in the phase of generation of the ESD.

Firstly, when the semiconductor integrated circuit 100 is held in the standby state, as shown in FIG. 1, each of the output signals from the first RC trigger circuit portion 10 and the second RC trigger circuit portion 20 becomes a voltage signal set at the Low level. In this case, since the voltage signal set at the Low level is inputted to each of the gate electrode 34 and the well region 31 of the clamp MOS 30, both of the channel path 41 and the bipolar path 42 (well region path) of the clamp MOS 30 become the close state (OFF state). Note that, in this case, only the OFF leakage current is caused to flow through the clamp MOS 30.

On the other hand, when the ESD surge is generated to enter the ESD protection circuit 1, at that moment (for a very short period of time), a through current (transient current) is caused to flow through the first RC series circuit 11 and as a result, the electric potential developed at the connection point between the first resistive element 12 and the first capacitive element 13 comes close to the grounding electric potential. That is to say, the electric potential developed at the connection point between the first resistive element 12 and the first capacitive element 13 (the electric potential developed at the input terminal of the first CMOS inverter 14) is changed from the High level to the Low level.

As a result, as shown in FIG. 3, a voltage signal set at the High level is outputted from the first CMOS inverter 14 to each of the gate electrode 34 of the clamp MOS 30, and the gate electrode of the second resistive element 22. As a result, the second resistive element 22 provided within the second RC trigger circuit portion 20 is set in the OFF state. In this case, the second resistive element 22 operates as a resistive element having a predetermined resistance value R2.

In addition, in this case, similarly to the case of the first RC trigger circuit portion 10, the through current is caused to flow through the second RC series circuit 21 as well provided within the second RC trigger circuit portion 20. As a result, the electric potential developed at the connection point between the second resistive element 22 and the second capacitive element 23 comes close to the grounding electric potential. That is to say, when the ESD surge is generated to enter the ESD protection circuit 1, the electric potential developed at the connection point between the second resistive element 22 and the second capacitive element 23 (the electric potential developed at the input terminal of the second CMOS inverter 24) is also changed from the High level to the Low level. As a result, as shown in FIG. 3, the voltage signal set at the High level is outputted from the second CMOS inverter 24 to the well region 31 of the clamp MOS 30.

As described above, when the ESD surge is generated to enter the ESD protection circuit 1, the voltage signal set at the High level is inputted to each of the gate electrode 34 and the well region 31 of the clamp MOS 30 both of which becomes the ON state in turn. As a result, an ESD surge current $I_{ESD}$ is caused to flow from the power source wiring 3 into the grounding wiring 4 through the clamp MOS 30 (refer to an arrow indicated by a heavy broken line in FIG. 3). Note that, in this case, since both of the gate electrode 34 and the well region 31 of the clamp MOS 30 become the ON state, the ESD surge current $I_{ESD}$ is caused to divergingly flow through the channel path 41 and the bipolar path 42 within the clamp MOS 30.

However, since the opening operation (hereinafter referred to as "a channel operation"), for the channel path 41, of the clamp MOS 30 has a high-speed responsibility for the ESD surge, the channel operation of the clamp MOS 30 is instantaneously carried out after generation of the ESD. For this reason, when the ESD surge is generated to enter the ESD protection circuit 1, an ESD surge current Ids (indicated by an outlined arrow in FIG. 4) is caused to instantaneously flow through the channel path 41 of the clamp MOS 30.

On the other hand, since the configuration of the bipolar transistor formed in the well region 31 of the clamp MOS 30 is the same as that of a load capacitive element, the responsibility of the opening operation (hereinafter referred to as "a well region operation") for the bipolar path 42 for the ESD surge is low. In addition, the second RC trigger circuit portion 20 is operated in accordance with the output signal from the first RC trigger circuit portion 10. Therefore, the operation of the second RC trigger circuit portion 20 lags behind the operation of the first RC trigger circuit portion 10 by a time corresponding to a delay amount of signal in the first RC trigger circuit portion 10. For this reason, it takes time for the bipolar path 42 to actually become the open state (until an ESD surge current Ibi (refer to an arrow indicated by a heavy solid line in FIG. 4) is caused to actually flow). That is to say, in the ESD protection circuit 1 of the second embodiment, when the ESD surge is generated to enter the ESD protection circuit 1, the well region of the clamp MOS 30 is set in the ON state accordingly. However, the time at which the bipolar path 42 becomes actually in the open state lags behind the time at which the channel path 41 becomes actually in the open state.

Figure 5:
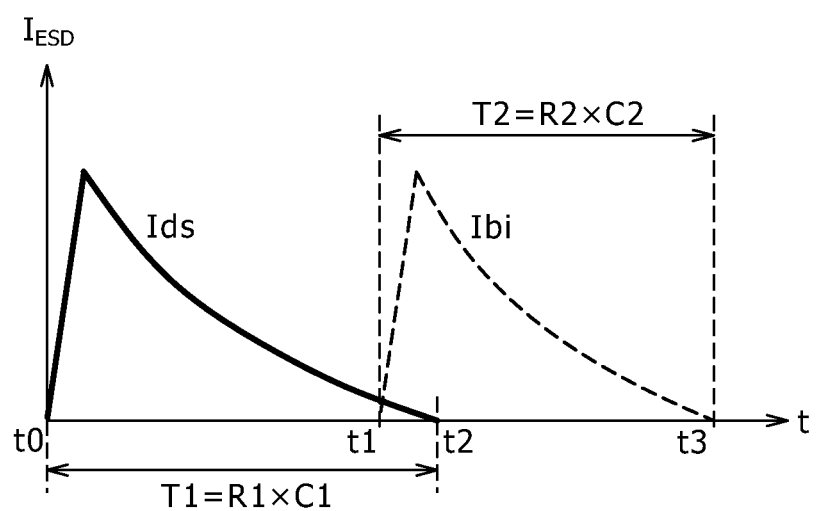
FIG. 5 is a graphical representation explaining the operation of the semiconductor integrated circuit according to the first embodiment of the present disclosure.

FIG. 5 shows a situation of the channel operation and the well region operation of the clamp MOS 30. It is noted that FIG. 5 schematically shows a change with time of the ESD surge current which is caused to flow through each of the current paths from the time of generation of the ESD (time t0). In FIG. 5, an axis of abscissa represents time t, and an axis of ordinate represents the ESD surge current $I_{ESD}$. In addition, in the case shown in FIG. 5, it is possible that the resistance value of the resistive element, and the capacitance value of the capacitive element in each of the RC trigger circuit portions are suitably set in such a way that the bipolar path 42 becomes substantially the open state (time t1) slightly before time t2 at which the channel path 41 is closed. By adopting such a configuration, it is possible to prevent a period of time of non-conduction of the ESD surge current $I_{ESD}$ from being generated between the channel operation and the well region operation of the clamp MOS 30.

In the ESD protection circuit 1 of the second embodiment, when the ESD is generated, firstly, the channel path 41 having the high-speed responsibility is opened, and the ESD surge current Ids (refer to characteristics indicated by a solid line in FIG. 5) is caused to flow through the channel path 41. After that, the ESD surge current Ids is caused to continuously flow through the channel path 41 for a period of time (for a period of time from the time t0 to the time t2 in FIG. 5) corresponding to the first time constant T1 (=R1×C1) of the first RC series circuit 11 composed of the first resistive element 12 and the first capacitive element 13.

On the other hand, the bipolar path 42 having the low-responsibility substantially becomes the open state (time t1) late by a predetermined time from the time t0 at which the ESD was generated. Thus, the ESD surge current Ibi (refer to characteristics indicated by a broken line in FIG. 5) is caused to flow through the bipolar path 42. After that, the ESD surge current Ibi is caused to continuously flow through the bipolar path 42 for a period of time (for a period of time from the time t1 to the time t3 in FIG. 5) corresponding to the second time constant T2 (=R2×C2) of the second RC series circuit 21 composed of the second resistive element 22 and the second capacitive element 23.

That is to say, in the ESD protection circuit 1 of the second embodiment, for the period of time from the phase (time t0) of generation of the ESD to the time t1 at which the well region operation starts, the ESD surge current $I_{ESD}$ is caused mainly to flow through the channel path 41. Also, after the time t1, the ESD surge current $I_{ESD}$ is caused mainly to flow through the bipolar path 42. In addition, for a period of time from the time t1 to the time t2 at which the channel path 41 is closed, the ESD surge current $I_{ESD}$ is caused to divergingly flow through both of the channel path 41 and the bipolar path 42.

It is noted that a relationship between the time t2 at which the channel path 41 is closed and the time t1 at which the bipolar path 42 is substantially opened is by no means limited to the case shown in FIG. 5, and is suitably set in consideration of, for example, the use application, the possible discharging phenomenon, and the like. For example, the first time constant T1 of the first RC series circuit 11 may be made large, thereby increasing a time zone for which the ESD surge current $I_{ESD}$ is caused to simultaneously flow through both of the channel path 41 and the bipolar path 42.

3. Comparative Example

Here, for making comparison with the semiconductor integrated circuit of the first embodiment including the ESD protection circuit of the second embodiment, a description will now be given with respect to the general configuration example (Comparative Example) of the existing ESD protection circuit like one, for example, described in Japanese Patent Laid-Open No. 2004-14929 or the like.

Figure 6:
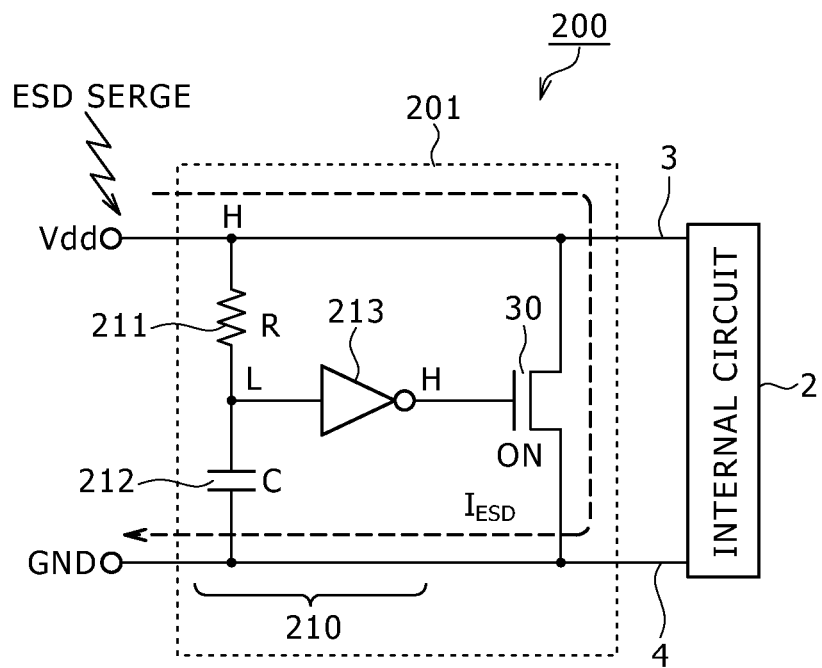
FIG. 6 is a schematic circuit diagram, partly in block, showing a configuration of a semiconductor integrated circuit including an ESD protection circuit of Comparative Example of the second embodiment of the present disclosure.

FIG. 6 shows a schematic circuit configuration of the semiconductor integrated circuit including the ESD protection circuit of Comparative Example of the second embodiment. It is noted that in the semiconductor integrated circuit 200 including the ESD protection circuit 201 of Comparative Example of the second embodiment shown in FIG. 6, the same constituent elements as those of the semiconductor integrated circuit 100 of the first embodiment described above and shown in FIG. 1 are designated by the same reference symbols, respectively. In addition, FIG. 6 shows a situation of operations of the constituent elements when the ESD surge is generated to enter the semiconductor integrated circuit 200 including the ESD protection circuit 201 of Comparative Example.

The semiconductor integrated circuit 200 includes the ESD protection circuit 201 of Comparative Example, the internal circuit 2, the power source wiring 3 to which the power source voltage Vdd is supplied, and the grounding wiring 4 connected to the grounding terminal. It is noted that since the internal circuit 2, the power source wiring 3, and the grounding wiring 4 of the semiconductor integrated circuit 200 in Comparative Example have the same configurations as those of the semiconductor integrated circuit 100 of the first embodiment, a description of the configurations of these constituent elements is omitted here for the sake of convenience.

The ESD protection circuit 201 of Comparative Example includes an RC trigger circuit portion 210 and the clamp MOS 30. The RC trigger circuit portion 210 includes an RC series circuit composed of a resistive element 211 and a capacitive element 212, and a CMOS inverter 213. It is noted that the RC trigger circuit portion 210 is configured in the same manner as that in the case of the first RC trigger circuit portion 10 in the first embodiment. In addition, the clamp MOS 30 in Comparative Example has the same configuration as that in the semiconductor integrated circuit 100 of the first embodiment described above. That is to say, the ESD protection circuit 201 of Comparative Example has the configuration in which the second RC trigger circuit portion 20 is omitted in the ESD protection circuit 1 in the first embodiment (refer to FIG. 1).

Figure 7:
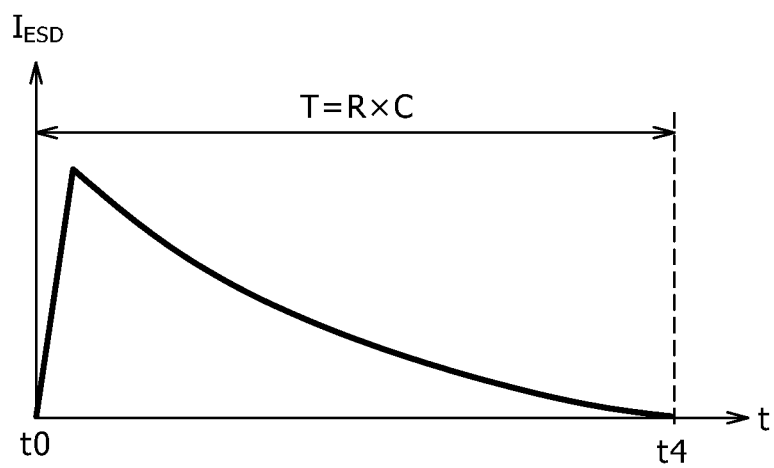
FIG. 7 is a graphical representation explaining an operation of the semiconductor integrated circuit including the ESD protection circuit of Comparative Example of the second embodiment.

Next, an operation of the ESD protection circuit 201 of Comparative Example will be described with reference to FIGS. 6 and 7. It is noted that FIG. 7 is a graphical representation showing change characteristics of the ESD surge current $I_{ESD}$ which is caused to flow through the clamp MOS 30 when the ESD surge is generated to enter the ESD protection circuit 201 of Comparative Example. In FIG. 7, an axis of abscissa represents time t, and an axis of ordinate represents the ESD surge current $I_{ESD}$.

When the ESD surge is generated to enter the ESD protection circuit 201 at predetermined time t0 (refer to FIG. 7), similarly to the case of the first embodiment described above, the through current is caused to flow through the RC series circuit within the RC trigger circuit portion 210. As a result, the electric potential developed at the connection point between the resistive element 211 and the capacitive element 212 comes close to the grounding electric potential. As a result, the electric potential developed at the connection point between the resistive element 211 and the capacitive element 212 is changed from the High level to the Low level (refer to FIG. 6). Thus, the voltage signal set at the High level is outputted from the CMOS inverter 213 to the gate electrode of the clamp MOS 30.

As a result, the clamp MOS 30 is set in the ON state through the gate electrode thereof to open the channel path. Also, the ESD surge current $I_{ESD}$ is caused to flow from the power source wiring 3 into the grounding wiring 4 through the clamp MOS 30 (refer to an arrow indicated by a heavy broken arrow in FIG. 6). After that (at and after the time t0), as shown in FIG. 7, the ESD surge current $I_{ESD}$ is caused to continuously flow through the clamp MOS 30 for a period of time (for a period of time from the time t0 to the time t4 in FIG. 7) corresponding to the time constant T (=R×C) of the RC series circuit composed of the resistive element 211 and the capacitive element 212. In the ESD protective circuit 201 of Comparative Example, the ESD surge current $I_{ESD}$ is caused to flow through the channel path of the clamp MOS 30 in such a manner, and the switching operation for the channel path is controlled by the RC trigger circuit portion 210.

[Various Kinds of Effects]

As described above, in the ESD protection circuit 201 of Comparative Example, when the ESD is generated, only the channel path of the clamp MOS 30 is opened. On the other hand, in the ESD protection circuit 1 of the second embodiment described above, when the ESD is generated, the two current paths: the channel path; and the bipolar path for the ESD surge current can be opened within the clamp MOS 30.

For this reason, in the ESD protection circuit 1 of the second embodiment described above, the discharging ability per unit area of the clamp MOS 30 can be enhanced and the ESD surge current can be caused to efficiently flow through the semiconductor integrated circuit 100 as compared with the case of Comparative Example. In particular, the discharging ability for the ESD surge current is larger in the bipolar path than in the channel path. Therefore, in the second embodiment described above, the discharging ability can be much more enhanced than Comparative Example (the case where the ESD surge current is caused to flow only through the channel path).

In addition, in the second embodiment described above, since the ESD surge current can be caused to decentrally flow through the clamp MOS 30, the size of the clamp MOS 30 can be reduced.

In addition thereto, in the ESD protection circuit 1 (the semiconductor integrated circuit 100) of the second embodiment (first embodiment) described above, the switching operations for the two current paths through each of which the ESD surge current is caused to flow can be individually controlled by the two RC trigger circuit portions corresponding to the two current paths, respectively. Also, in the second embodiment described above, the open periods of time for the two current paths can be individually set by the two RC trigger circuit portions corresponding to the open periods of time, respectively. For this reason, the following advantages can be obtained.

Although there are various kinds of tests in a specification test for the ESD protection circuit, in general, for example, there is used the specification test using an ESD model such as a Human Body Model (HBM), a Machine Model (MM) or a Charged Device Model (CDM). In these various kinds of ESD models, ESD surge current waveforms (discharging characteristics) for time are different from one another.

The HBM is an ESD model having an ESD surge current waveform in which the ESD surge current becomes maximum right after generation of the ESD, and the current value is then gradually reduced with time. Thus, the HBM is the ESD model in which the discharging phenomenon (the phenomenon in which the ESD surge current is caused to flow) continues for a relatively long period of time. Specifically, the HBM is the ESD model in which the discharging phenomenon continues for about 1 μsec. On the other hand, the CDM is a model in which the duration time of the discharging phenomenon is a short period of time of about 1 μsec. Thus, the CDM is the ESD model in which the ESD surge current waveform becomes a pulse-like waveform. In addition, the MM is an ESD model having a waveform in which the ESD surge current is attenuated with time while it is vibrated.

In order to respond to the various kinds of ESD models, in the ESD protection circuit, the time constant (the resistance value of the resistive element×the capacitance value of the capacitive element) of the RC series circuit within the RC trigger circuit portion needs to be suitably set in correspondence to the possible discharging phenomenon in order to adjust the current flow time of the ESD surge current. In addition, when the responsibility of the ESD protection circuit for the ESD is low, the ESD surge current is caused to flow through the internal circuit before the ESD surge current is caused to flow through the ESD protection circuit, thereby destroying the internal circuit. Therefore, in the ESD protection circuit, the responsibility for the ESD also needs to be taken into consideration.

For meeting the request described above in the ESD protection circuit 201 of Comparative Example, the resistance value R of the resistive element 211, and the capacitance value C of the capacitive element 212 within the ESD protection circuit 201 need to be suitably set every kind of possible discharging phenomenon.

On the other hand, in the ESD protection circuit 1 of the second embodiment described above, as previously stated, the channel path (channel operation) and the bipolar path (well region operation) which are different from each other in responsibility for the ESD are used as the current paths for the ESD surge currents. Also, the switching operations and opening periods of time for the channel path and the bipolar path can be individually controlled by the first RC trigger circuit portion 10 and the second RC trigger circuit portion 20. For this reason, with the ESD protection circuit 1 of the second embodiment, for example, the channel operation having the high responsibility can respond to the short-time discharging phenomenon having the waveform of the pulse-like surge current like the CDM. In addition thereto, in the second (first) embodiment described above, for example, both of the channel operation and the well region operation can respond to the discharging phenomenon, like the HBM, which continues for a relatively long time.

That is to say, in the second (first) embodiment described above, one ESD protection circuit 1 can respond to the various kinds of ESDs. Thus, for the ESD phenomenon containing therein plural ESD discharging waveforms different from one another which, for example, are found in the system levels, the high discharging ability is obtained.

4. Various Kinds of Modified Changes

The configuration of the ESD protection circuit according to the second embodiment of the present disclosure is by no means limited to the circuit configuration (refer to FIG. 1) in the first embodiment, and thus may be arbitrary as long as a circuit configuration is adopted with which the switching control and the setting of the opening period of time for the channel path and the bipolar path of the clamp MOS 30 can be individually carried out. In this case, a description will be given below with respect to various kinds of Modified Changes of the ESD protection circuit 1 of the second embodiment.

[Modified Change 1]

Although in the second embodiment described above, the case where the first resistive element 12 is composed of the resistive element (poly silicon resistor) having the given resistance value, and the second resistive element 22 is composed of the resistance change device (P-channel MOSFET) has been described, the present disclosure is by no means limited thereto.

For example, both of the first resistive element and the second resistive element may also be composed of the resistive elements having the given resistance values, respectively. In addition, both of the first resistive element and the second resistive element may also be composed of the resistance change devices, respectively. In addition thereto, the first resistive element may be composed of the resistance change device, and the second resistive element may be composed of the resistive element having the given resistance value. In this case, an example (Modified Change 1) in which both of the first resistive element and the second resistive element are composed of the resistive elements having the given resistance values, respectively, will be described below.

Figure 8:
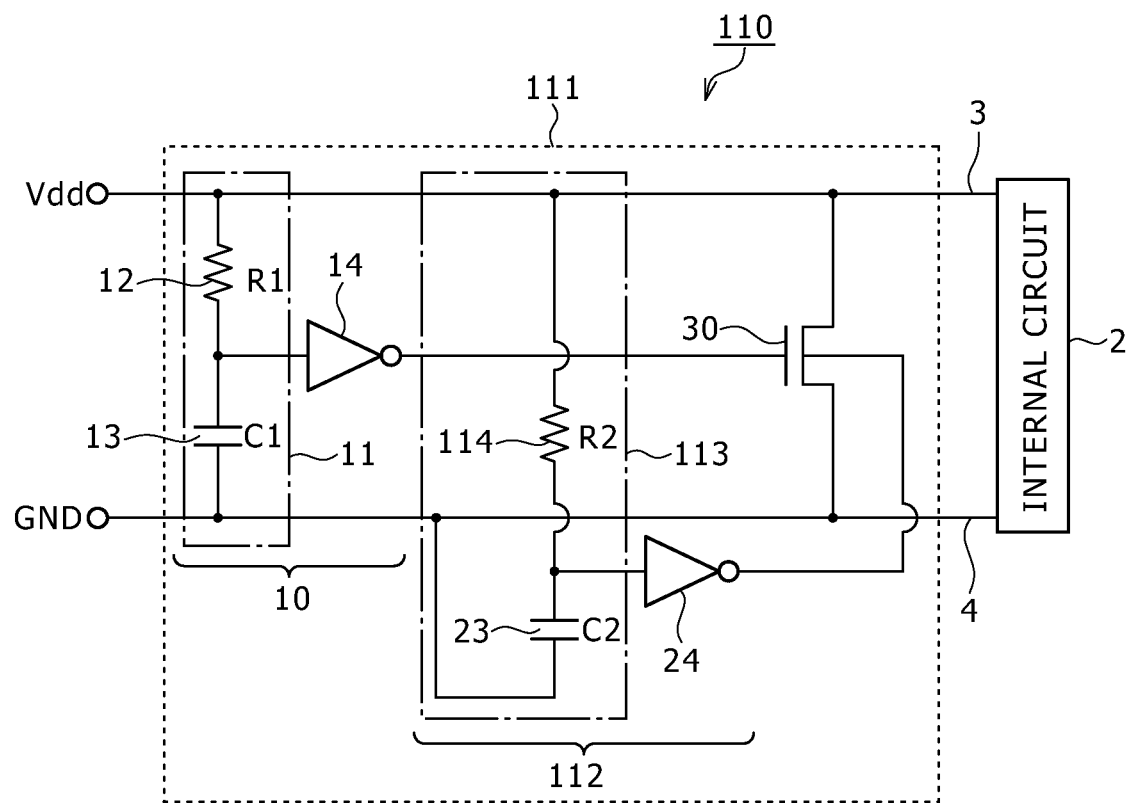
FIG. 8 is a schematic circuit diagram, partly in block, showing a configuration of a semiconductor integrated circuit including an ESD protection circuit according to Modified Change 1 of the second embodiment of the present disclosure.

FIG. 8 shows a circuit configuration of a semiconductor integrated circuit including an ESD protection circuit according to Modified Change 1 of the second embodiment of the present disclosure. Note that, in the semiconductor integrated circuit 110 (the ESD protection circuit 111) of Modified Change 1 shown in FIG. 8, the same constituent elements as those of the semiconductor integrated circuit 100 (the ESD protection circuit 1) shown in FIG. 1 are designated by the same reference symbols, respectively.

As can be seen from the comparison between the circuit configuration shown in FIG. 8 and the circuit configuration shown in FIG. 1, the semiconductor integrated circuit 110 in Modified Change 1 adopts a configuration in which in the semiconductor integrated circuit 100 of the first embodiment, the second resistive element 22 provided within the second RC trigger circuit 20 is replaced with a resistive element having a given resistance value. It is noted that in the semiconductor integrated circuit 110 in Modified Change 1, the configuration except for the second resistive element is the same as the corresponding configuration of the semiconductor integrated circuit 100 of the first embodiment described above.

In this case, the second resistive element 114 within the second RC trigger circuit portion 112, for example, can be composed of an element such as a poly silicon resistor. Also, when a resistance value of the second resistive element 114 is set to the resistance value R2 when the second resistive element 22 in the second embodiment described above is held in the OFF state (in the phase of generation of the ESD), the second time constant T2 of the second RC series circuit 113 composed of the second resistive element 114 and the second capacitive element 23 becomes R2×C2. In this case, the ESD protection circuit 111 of Modified Change 1 can be operated similarly to the ESD protection circuit 1 of the second embodiment, and thus the same effects as those in the second (first) embodiment described above are obtained.

[Modified Change 2]

Although in the second (first) embodiment described above, the case where one CMOS inverter is provided within each of the RC trigger circuit portions is described, the present disclosure is by no means limited thereto. For example, three or more odd CMOS inverters may be provided in at least one of the first RC trigger circuit portion 10 and the second RC trigger circuit portion 20, and multiple stages of the three or more odd CMOS inverters may also be connected to one another. In this case, it is possible to further enhance the noise resistance property.

In addition, although in the second (first) embodiment described above, the case where the inverter circuit provided within each of the RC trigger circuit portions is composed of the CMOS inverter is described, the present disclosure is by no means limited thereto. That is to say, an inverter circuit having an arbitrary configuration can be used as long as the arbitrary configuration is one with which the same operation as that of the CMOS inverter is carried out.

[Modified Change 3]

Although in the second (first) embodiment described above, the case where the power source voltage Vdd is supplied to the power source wiring 3 is described, the present disclosure is by no means limited thereto.

The ESD protection circuit 1 of the second embodiment is operated similarly even when no power source voltage Vdd is supplied to the power source wiring 3 (for example, when the inspection and the test for the semiconductor integrated circuit 100 are carried out, when the power source is held in the OFF state in the state in which the semiconductor integrated circuit 100 is mounted to the electronic apparatus or the like, and so forth). That is to say, even when the input terminal of the power source wiring 3 is held in the open state (the ground (GND) is fixed), in the phase of generation of the ESD, the ESD protection circuit 1 is operated similarly to the case of the second (first) embodiment described above. In Modified Change 3 as well, the same effects as those in the second (first) embodiment described above are obtained.

It is noted that the present disclosure can also adopt the following constitutions.

(1) A semiconductor integrated circuit including:

a clamp MOS transistor having a drain region and a source region connected to a power source wiring and a grounding wiring, respectively, and causing a surge current to flow through a channel path and a bipolar path between the drain region and the source region;

a first trigger circuit portion configured to be provided between the power source wiring and the grounding wiring, connected at an output terminal thereof to a gate terminal of the clamp MOS transistor, and control switching for the channel path within the clamp MOS transistor;

a second trigger circuit portion configured to be provided between the power source wiring and the grounding wiring, connected at an output terminal thereof to a well region of the clamp MOS transistor, and control switching for the bipolar path within the clamp MOS transistor; and an internal circuit connected to each of the power source wiring and the grounding wiring.

(2) The semiconductor integrated circuit described in the paragraph (1), in which the first trigger circuit portion includes a first resistive element, a first capacitive element, and a first inverter circuit, the first resistive element and the first capacitive element are connected in series with each other, an input terminal of the first inverter circuit is connected to a connection point between the first resistive element and the first capacitive element, and an output terminal of the first inverter circuit is connected to the gate terminal of the clamp MOS transistor; and the second trigger circuit portion includes a second resistive element, a second capacitive element, and a second inverter circuit, the second resistive element and the second capacitive element are connected in series with each other, an input terminal of the second inverter circuit is connected to a connection point between the second resistive element and the second capacitive element, and an output terminal of the second inverter circuit is connected to the well region of the clamp MOS transistor.

(3) The semiconductor integrated circuit described in the paragraph (2), in which at least one of the first resistive element and the second resistive element is a MOS transistor.

(4) The semiconductor integrated circuit described in the paragraph (2), in which at least one of the first resistive element and the second resistive element is a resistive element having a given resistance value.

(5) The semiconductor integrated circuit described in the paragraph (3) or (4), in which one of the first resistive element and the second resistive element is a MOS transistor, and the other is a resistive element having a given resistance value.

(6) The semiconductor integrated circuit described in any one of the paragraphs (1) to (5), in which at least one of the first inverter circuit and the second inverter circuit includes an odd number of CMOS image inverters, and multiple stages of the odd number of CMOS inverters are connected.

(7) The semiconductor integrated circuit described in any one of the paragraphs (1) to (6), in which the channel path of the clamp MOS transistor becomes an open state in advance of the bipolar path, and the bipolar path becomes an open state before the channel path is closed.

(8) A protection circuit including:
a clamp MOS transistor having a drain region and a source region connected to a power source wiring and a grounding wiring, respectively, and causing a surge current to flow through a channel path and a bipolar path between the drain region and the source region;
a first trigger circuit portion configured to be provided between the power source wiring and the grounding wiring, connected at an output terminal thereof to a gate terminal of the clamp MOS transistor, and control switching for the channel path within the clamp MOS transistor; and
a second trigger circuit portion configured to be provided between the power source wiring and the grounding wiring, connected at an output terminal thereof to a well region of the clamp MOS transistor, and control switching for the bipolar path within the clamp MOS transistor.

The present disclosure contains subject matter related to that disclosed in Japanese Priority Patent Application JP 2011-190431 filed in the Japan Patent Office on Sep. 1, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor integrated circuit comprising:
a clamp MOS transistor having a drain region and a source region connected to a power source wiring and a grounding wiring, respectively, and causing a surge current to flow through a channel path and a bipolar path between said drain region and said source region;
a first trigger circuit portion configured to be provided between said power source wiring and said grounding wiring, connected at an output terminal thereof to a gate terminal of said clamp MOS transistor, and control switching for said channel path within said clamp MOS transistor;
a second trigger circuit portion configured to be provided between said power source wiring and said grounding wiring, connected at an output terminal thereof to a well region of said clamp MOS transistor, and control switching for said bipolar path within said clamp MOS transistor; and
an internal circuit connected to each of said power source wiring and said grounding wiring.

2. The semiconductor integrated circuit according to claim 1,
wherein said first trigger circuit portion includes a first resistive element, a first capacitive element, and a first inverter circuit, said first resistive element and said first capacitive element are connected in series with each other, an input terminal of said first inverter circuit is connected to a connection point between said first resistive element and said first capacitive element, and an output terminal of said first inverter circuit is connected to said gate terminal of said clamp MOS transistor; and
said second trigger circuit portion includes a second resistive element, a second capacitive element, and a second inverter circuit, said second resistive element and said second capacitive element are connected in series with each other, an input terminal of said second inverter circuit is connected to a connection point between said second resistive element and said second capacitive element, and an output terminal of said second inverter circuit is connected to said well region of said clamp MOS transistor.

3. The semiconductor integrated circuit according to claim 2, wherein at least one of said first resistive element and said second resistive element is a MOS transistor.

4. The semiconductor integrated circuit according to claim 3, wherein one of said first resistive element and said second resistive element is a MOS transistor, and the other is a resistive element having a given resistance value.

5. The semiconductor integrated circuit according to claim 2, wherein at least one of said first resistive element and said second resistive element is a resistive element having a given resistance value.

6. The semiconductor integrated circuit according to claim 1, wherein at least one of said first inverter circuit and said second inverter circuit includes an odd number of CMOS image inverters, and multiple stages of the odd number of CMOS inverters are connected.

7. The semiconductor integrated circuit according to claim 1, wherein said channel path of said clamp MOS transistor becomes an open state in advance of said bipolar path, and said bipolar path becomes an open state before said channel path is closed.

8. A protection circuit comprising:
a clamp MOS transistor having a drain region and a source region connected to a power source wiring and a grounding wiring, respectively, and causing a surge current to flow through a channel path and a bipolar path between said drain region and said source region;
a first trigger circuit portion configured to be provided between said power source wiring and said grounding wiring, connected at an output terminal thereof to a gate terminal of said clamp MOS transistor, and control switching for said channel path within said clamp MOS transistor; and
a second trigger circuit portion configured to be provided between said power source wiring and said grounding wiring, connected at an output terminal thereof to a well region of said clamp MOS transistor, and control switching for said bipolar path within said clamp MOS transistor.

* * * * *